United States Patent
Gomez-Iglesias et al.

(10) Patent No.: US 9,490,389 B2
(45) Date of Patent: Nov. 8, 2016

(54) METHOD FOR PRODUCING OPTOELECTRONIC SEMICONDUCTOR CHIPS

(71) Applicant: OSRAM Opto Semiconductors GmbH, Regensburg (DE)

(72) Inventors: Alvaro Gomez-Iglesias, Regensburg (DE); Marika Hirmer, Wiesent (DE); Alexander Frey, Lappersdorf (DE); Lorenzo Zini, Regensburg (DE); Harald Laux, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 14/857,698

(22) Filed: Sep. 17, 2015

(65) Prior Publication Data
US 2016/0079468 A1 Mar. 17, 2016

(30) Foreign Application Priority Data
Sep. 17, 2014 (DE) .................. 10 2014 113 380

(51) Int. Cl.
| | |
|---|---|
| H01L 21/00 | (2006.01) |
| H01L 33/00 | (2010.01) |
| H01L 33/10 | (2010.01) |
| H01L 33/12 | (2010.01) |
| H01L 33/32 | (2010.01) |
| H01L 33/22 | (2010.01) |
| H01L 33/24 | (2010.01) |
| H01L 33/02 | (2010.01) |

(52) U.S. Cl.
CPC .......... *H01L 33/0079* (2013.01); *H01L 33/02* (2013.01); *H01L 33/10* (2013.01); *H01L 33/12* (2013.01); *H01L 33/22* (2013.01); *H01L 33/24* (2013.01); *H01L 33/32* (2013.01)

(58) Field of Classification Search
CPC ... H01L 33/24; H01L 33/0079; H01L 33/32; H01L 33/12; H01L 33/10; H01L 33/06; H01L 33/22; H01L 33/02
USPC .......................................... 438/29
See application file for complete search history.

(56) References Cited

U.S. PATENT DOCUMENTS

| | | | |
|---|---|---|---|
| 6,875,627 B2 | 4/2005 | Bour et al. | |
| 2009/0053845 A1 | 2/2009 | Wong et al. | |
| 2013/0285095 A1* | 10/2013 | Moon | ............ H01L 33/02 257/98 |

FOREIGN PATENT DOCUMENTS

| | | |
|---|---|---|
| DE | 10260183 A1 | 7/2004 |
| DE | 102014105192 A1 | 10/2015 |
| WO | 2013/160343 A1 | 10/2013 |

OTHER PUBLICATIONS

Takeuchi, M. et al.: "AlN/AlGaN short-period superlattice sacrificial layers in laser lift-off for vertical-type AlGaN-based deep ultraviolet light emitting diodes", Applied Physics Letters, vol. 94, pp. 061117-1-061117-3, 2009.

*Primary Examiner* — Thanh T Nguyen
(74) *Attorney, Agent, or Firm* — McDermott Will & Emery LLP

(57) ABSTRACT

The method is designed for producing optoelectronic semiconductor chips and comprises the steps:
A) providing a carrier substrate (1),
B) applying a semiconductor layer sequence (2) onto the carrier substrate (1), and
C) detaching the finished semiconductor layer sequence (2) from the carrier substrate (1) by means of laser radiation (R) with a wavelength (L) through the carrier substrate (1), wherein
the semiconductor layer sequence (2) has a buffer layer stack (20) and a functional stack with an active layer (21) for generating light (22),
the absorber layer (23) is grown within the buffer layer stack (20) from a material for absorbing the laser radiation (R) and all the remaining layers (24 and 25) of the buffer layer stack (20) are transmissive to the laser radiation (R),
a material of the functional stack (22) preferably has an absorbent action for the laser radiation (R), and
in step C) the semiconductor layer sequence (2) is detached in the region of the absorber layer (23).

15 Claims, 4 Drawing Sheets

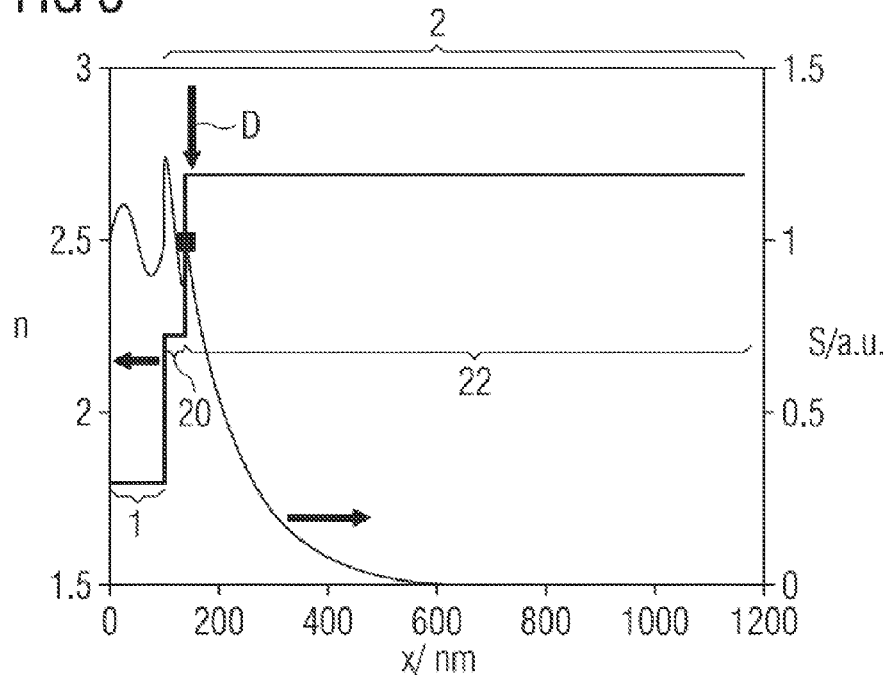
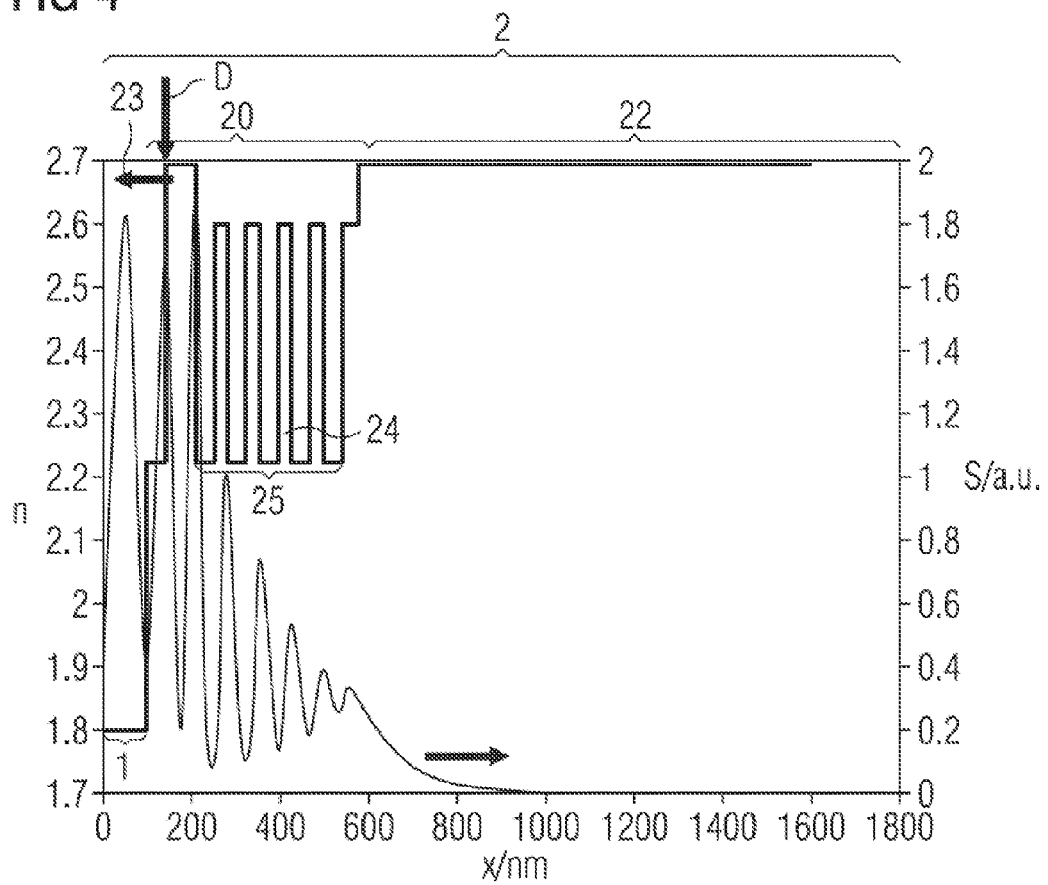

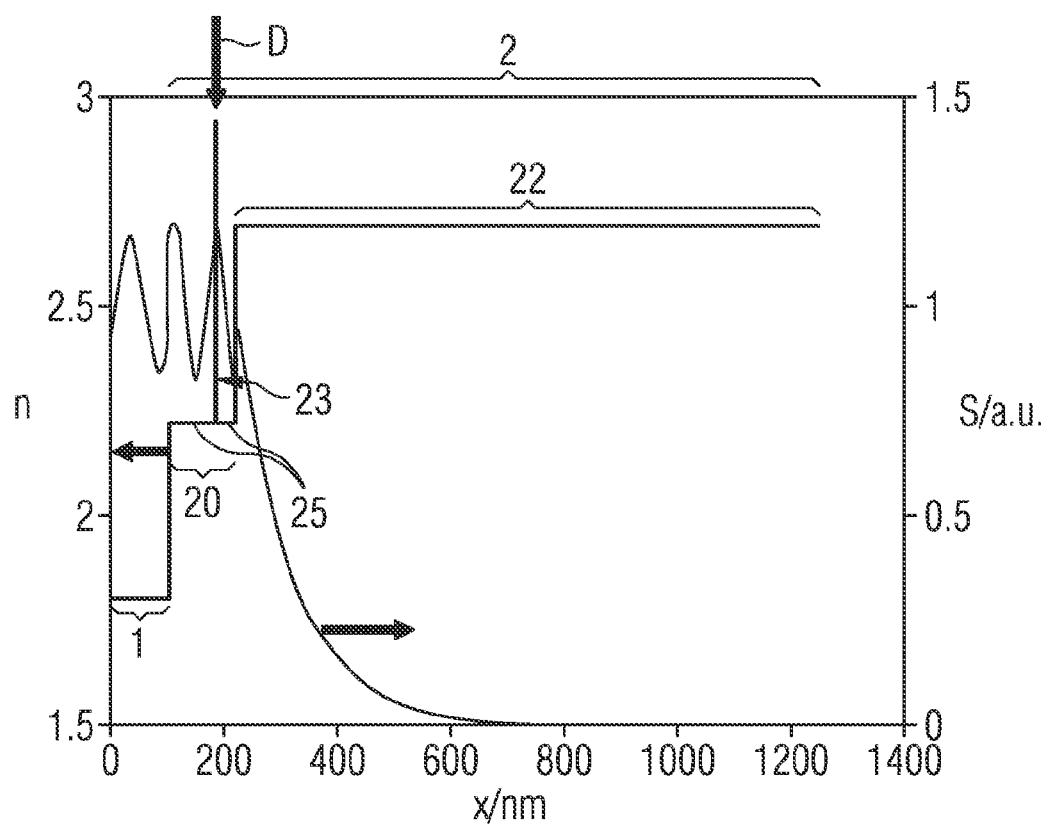

METHOD FOR PRODUCING OPTOELECTRONIC SEMICONDUCTOR CHIPS

CROSS REFERENCE TO RELATED APPLICATION

This patent application claims the priority of German patent application 10 2014 113 380.3, the disclosure content of which is hereby incorporated by reference.

SUMMARY

A method is provided for producing optoelectronic semiconductor chips.

An object is that of providing a method with which a semiconductor layer sequence may be efficiently detached from a carrier substrate.

Said object is achieved inter alia by a method having the features of the independent claim. Preferred further developments constitute the subject matter of the dependent claims.

According to at least one embodiment, the finished optoelectronic semiconductor chip comprises a functional stack. The functional stack is part of a semiconductor layer sequence applied onto, preferably grown on, a carrier substrate. The carrier substrate may thus preferably be a growth substrate for the semiconductor layer sequence. The carrier substrate may likewise be a temporary intermediate carrier on which the semiconductor layer sequence is temporarily fastened during the manufacturing method.

The functional stack comprises at least one active layer for generating light. In particular, the at least one active layer comprises a single quantum well structure, a multiple quantum well structure and/or at least one pn junction. The wavelength of the light generated in the active layer, relative to a wavelength of maximum intensity, is preferably at least 380 nm or 430 nm or 460 nm and/or at most 1500 nm or 1300 nm or 980 nm or 530 nm.

According to at least one embodiment, the method comprises the step of providing a carrier substrate. The carrier substrate is for example radiation-transmissive to radiation generated in the at least one active layer. In particular, a band edge of a material of the carrier substrate is larger than a band edge of the active layer or active layers with the smallest band edge. The band edge is here the energy gap between the valence band and the conduction band of the corresponding material.

According to at least one embodiment, the method comprises the step of applying, in particular of growing, a semiconductor layer sequence on the carrier substrate. The semiconductor layer sequence is preferably applied or grown epitaxially and/or by vapour deposition and/or by sputtering. For example, the semiconductor layer sequence is applied as described in document WO 2013/160343 A1, the disclosure content of which is included by reference. In particular, the semiconductor layer sequence is grown contiguously and in one piece on the carrier substrate.

According to at least one embodiment, the method comprises the step of detaching the fully grown semiconductor layer sequence from the carrier substrate. Detachment proceeds entirely or in part by means of laser radiation. In other words, detachment involves a laser lift-off, or LLO for short, method.

According to at least one embodiment, the laser radiation, which has a laser wavelength, is guided through the carrier substrate to the semiconductor layer sequence. A photon energy, $E_p$ for short, of the laser radiation with $E_p=hc/L$, wherein L corresponds to the wavelength of maximum intensity of the laser radiation, is here smaller than the band edge of the material of the carrier substrate. The carrier substrate is accordingly transmissive to the laser radiation.

According to at least one embodiment, the semiconductor layer sequence comprises, in the direction away from the carrier substrate, a buffer layer stack and the functional stack. The carrier substrate, the buffer layer stack and the functional stack here preferably follow on directly from one another in the stated sequence.

According to at least one embodiment, there is at least one absorber layer located within the buffer layer stack. The one or more absorber layers are thus not located at one edge of the buffer layer stack and therefore directly adjoin neither the carrier substrate nor the functional stack.

According to at least one embodiment, the absorber layer is grown from a material which is designed to absorb the laser radiation. In other words, the material of the absorber layer has a band edge which is smaller than the photon energy of the laser radiation.

According to at least one embodiment, all the remaining layers of the buffer layer stack, namely all the layers with the exception of the at least one absorber layer, are transmissive to the laser radiation. Transmissive here preferably means that a band gap of all these remaining layers is greater than the photon energy of the laser radiation.

According to at least one embodiment, a material of the functional stack has an absorbent action for the laser radiation. This is the case either for the entire functional stack or at least for one layer of the functional stack which is located closest to the carrier substrate. Such a layer is, for example, a current spreading layer in the finished semiconductor chip. In other words, the material of functional stack then has at least on a side closest to the carrier substrate a band edge which is smaller than the photon energy of the laser radiation.

According to at least one embodiment, the semiconductor layer sequence is detached from the carrier substrate in the region of the absorber layer. In other words, the absorber layer is destroyed or damaged by the laser radiation in such a manner that a mechanical connection between the carrier substrate and the functional stack is weakened or broken down in the region of the absorber layer.

In at least one embodiment, the method is designed for producing optoelectronic semiconductor chips, in particular light-emitting diode chips, and comprises at least the following steps, preferably in the stated sequence:

A) providing a carrier substrate,
B) applying a semiconductor layer sequence onto the carrier substrate, and
C) detaching the fully applied semiconductor layer sequence from the carrier substrate by means of laser radiation with a laser wavelength through the carrier substrate, wherein the semiconductor layer sequence, in the direction away from the carrier substrate, has a buffer layer stack and a functional stack, wherein the functional stack comprises at least one active layer for generating light and the at least one absorber layer is located within the buffer layer stack, wherein the absorber layer is produced from a material for absorbing the laser radiation and all the remaining layers of the buffer layer stack are transmissive to the laser radiation, wherein a material of the functional stack at least in a region closest to the carrier substrate preferably has an absorbent action for the laser radiation and in step C) the semiconductor layer sequence is detached from the carrier substrate in the region of the absorber layer.

Epitaxially grown semiconductor layer sequences which are grown on substrates with low electrical and/or thermal conductivity are conventionally mounted on carriers and detached from the carrier substrate. One possible way of achieving detachment from the carrier substrate involves laser lift-off, or LLO for short, methods. The laser radiation is here conventionally directed through the substrate into a functional stack of the semiconductor layer sequence. The wavelength of the laser radiation is selected such that the latter can propagate through the substrate while, however, being strongly absorbed at the semiconductor layer sequence.

This absorption of the laser radiation leads to heating of the material absorbing the laser radiation and hence to detachment at the absorbing material, such that the functional stack is separated from the substrate. The comparatively high energy densities which are required for this kind of detachment mean that the substrate and also the remaining layers of the functional stack may be damaged. In particular, if the substrate cannot be reused for another growth process this is associated with elevated manufacturing costs. Moreover, the elevated energy density may give rise to defects in the functional stack which may impair the service life and/or performance of the semiconductor chip to be produced.

Because, in the method described herein, the absorber layer is arranged within the buffer layer stack, the buffer layer stack could form an in particular thermal barrier both towards the carrier substrate and towards the functional stack. As a consequence, damage brought about by the detachment by means of laser radiation both to the carrier substrate and to the functional stack may be prevented or reduced.

It is likewise possible for the structure of the buffer layer stack to boost the power density of the irradiated laser radiation in the absorber layer interferometrically, for example by multiple reflection at layers in the buffer layer stack. In this way, it is also possible to reduce the intensity of the overall irradiated laser radiation, whereby damage to the carrier substrate and/or to the functional layer stack may likewise be suppressed.

According to at least one embodiment, a distance between the absorber layer and edges of the buffer layer stack amounts, along a growth direction of the semiconductor layer sequence, to at least $L/(4\ n)$. L here denotes the wavelength of the laser radiation, in particular for the wavelength of maximum intensity. n denotes the average refractive index of the buffer layer stack, in particular at the corresponding side of the buffer layer stack. Alternatively or additionally, the distance between the absorber layer and the edges amounts in each case to at least 30 nm or 40 nm.

According to at least one embodiment, the buffer layer stack has an overall thickness of at least $L/(2\ n)$. Alternatively or additionally, the thickness of the buffer layer stack is at least 80 nm or 120 nm or 200 nm or 0.5 µm. It is likewise possible for the buffer layer stack to have a maximum thickness of 5 µm or 2 µm or 1.5 µm or 0.75 µm or 0.4 µm or $(2\ L)/n$.

According to at least one embodiment, the absorber layer is located at a maximum of a radiant intensity of the laser radiation in the semiconductor layer sequence. The radiant intensity is here proportional to a square of the electrical field strength of the laser radiation.

According to at least one embodiment, the absorber layer is located, counting from the carrier substrate, at the second maximum of the radiant intensity in the buffer layer stack. In other words, the absorber layer is then not located, viewed from the carrier substrate, at the first intensity maximum within the semiconductor layer stack.

According to at least one embodiment, the buffer layer stack has a thickness of $[(1+2N)L]/(4\ n)$. L is here the wavelength of laser radiation. n is the average refractive index of the buffer layer stack. N is a natural number of $\geq 1$ or $\geq 2$. Preferably, $N \leq 5$ or $N \leq 4$. The stated thickness of the buffer layer stack is preferably present with a tolerance of at most 5 nm or 2 nm.

According to at least one embodiment, the buffer layer stack in the region between the carrier substrate and the absorber layer or the buffer layer stack overall takes the form of an antireflection layer for the laser radiation. For example, the buffer layer stack then has a thickness between the carrier substrate and the absorber layer of $L/(4\ n)$.

According to at least one embodiment, the buffer layer stack in the region between the absorber layer and the functional stack or the buffer layer stack overall takes the form of a Bragg reflector for the laser radiation. The functional stack then comprises a sequence of layers with a high refractive index and with a low refractive index, wherein said layers alternate. The thickness of the individual layers is preferably $L/(4\ n)$, for example with a tolerance of at most 5 nm or 2 nm.

According to at least one embodiment, the buffer layer stack comprises exactly one absorber layer. It is alternatively possible for the buffer layer stack to have exactly two or exactly three or exactly four absorber layers. If a plurality of absorber layers are present, they are preferably in each case located at a maximum of the radiant intensity of the laser radiation. Particularly preferably, however, there is exactly one absorber layer present in the buffer layer stack and hence also in the semiconductor layer stack.

According to at least one embodiment, the absorber layer is thin. Thin may mean that the thickness of the absorber layer is at least 1 nm or 1.5 nm or 2 nm and/or that the thickness is at most $L/(4\ n_A)$ or $L/(8\ n_A)$ or $L/(12\ n_A)$, wherein $n_A$ is the refractive index of the absorber layer. Alternatively or additionally, the thickness of the absorber layer is at most 15 nm or 10 nm or 7 nm or 4 nm. In other words, the absorber layer is then selected to be of a thinness such that the absorber layer has no or no significant influence on a position of maxima and minima of radiant intensity of the laser radiation in the semiconductor layer sequence.

According to at least one embodiment, the absorber layer is comparatively thick. This may mean that the absorber layer has a thickness of at least $L/(4\ n_A)$. The thickness of the absorber layer is preferably $L/(2\ n_A)$, for example with a tolerance of at most 5 nm or 2 nm. Alternatively or additionally, the thickness of absorber layer amounts to at least 75 nm or 100 nm and/or at most 200 nm or 150 nm or 100 nm.

According to at least one embodiment, the buffer layer stack comprises a superlattice or the buffer layer stack is completely formed by a superlattice, for instance only with the exception of the absorber layer. The superlattice is formed by a plurality of alternating layers with an alternately high and low refractive index. The layers of the superlattice are preferably transparent to the laser radiation. In other words, an absorption edge of the materials of the alternating layers is at a higher energy than the photon energy $E_p$ of the laser radiation.

According to at least one embodiment, the layers of the superlattice in each case have a thickness which is smaller than L/(4 n) or L/(12 n). Alternatively or additionally, the thickness of the alternating layers of the superlattice is at least 1 nm or 1.5 nm or 2 nm and/or at most 15 nm or 10 nm or 7 nm or 3.5 nm. The layers of the superlattice are then not the layers of a Bragg reflector. The absorber layer is preferably located within the superlattice and may for example replace one of the layers with a high refractive index.

According to at least one embodiment, the superlattice has at least five or ten or 20 pairs of alternating layers. Alternatively or additionally, the superlattice has at most 75 or 50 or 35 such pairs.

According to at least one embodiment, there is a refractive index difference between the alternating layers of at least 0.05 or 0.1 or 0.15. Alternatively or additionally, said refractive index difference is at most 0.5 or 0.35 or 0.25. Corresponding refractive index differences may also apply to layers of a Bragg reflector which is included by the buffer layer stack.

According to at least one embodiment, the carrier substrate is a sapphire substrate or an SiC substrate. A growth surface of the carrier substrate, on which the semiconductor layer sequence is grown, may be planar or also patterned. It is, for example, a patterned sapphire substrate or PSS for short.

According to at least one embodiment, the semiconductor layer sequence is based on a III-V compound semiconductor material. The semiconductor material is for example a nitride compound semiconductor material such as $Al_nIn_{1-n-m}Ga_mN$ or a phosphide compound semiconductor material such as $Al_nIn_{1-n-m}Ga_mP$ or also an arsenide compound semiconductor material such as $Al_nIn_{1-n-m}Ga_mAs$, wherein in each case $0 \leq n \leq 1$, $0 \leq m \leq 1$ and $n+m \leq 1$ applies. The semiconductor layer sequence may comprise dopants and additional constituents. For simplicity's sake, however, only the essential constituents of the crystal lattice of the semiconductor layer sequence are indicated, i.e. Al, As, Ga, In, N or P, even if these may in part be replaced and/or supplemented by small quantities of further substances. The semiconductor layer sequence is particularly preferably based on the AlInGaN material system.

According to at least one embodiment, the absorber layer is grown from GaN or InGaN. Dopant additions are disregarded here. If the absorber layer is an InGaN layer, the absorber layer may have the same In content as an active layer of the functional stack. For example, the In content, i.e. the proportion of Ga lattice sites replaced by In, is at least 1% or 3% or 5% or 10% and/or at most 30% or 23% or 18% or 10%. A higher absorption cross-section for laser radiation is achievable by InGaN layers.

According to at least one embodiment, the remaining layers of the buffer layer stack are grown from AlN and/or AlGaN. In the case of AlGaN layers, the Al content preferably amounts to at least 1% or 5% or 15% and/or at most 50% or 35% or 25%.

According to at least one embodiment, the layer of the functional stack which is located closest to the carrier substrate is a GaN layer. The thickness of this GaN layer is for example at least 0.5 µm or 1 µm or 2 µm and/or at most 5 µm or 3 µm. In other words, said layer of the functional stack which is located closest to the carrier substrate is comparatively thick, relative to the absorber layer. Said layer of the functional stack is likewise preferably thicker than the entire buffer layer stack. The thickness of said layer of the functional stack exceeds the thickness of the entire buffer layer stack for example by at least a factor of 2 or 4 or 8.

According to at least one embodiment, the laser radiation has a wavelength of maximum intensity which is at least 150 nm or 200 nm or 240 nm or 280 nm or 340 nm. Alternatively or additionally, said wavelength is at most 450 nm or 410 nm or 360 nm. In particular, the wavelength of the laser radiation is at roughly 355 nm. For example, it is also possible to use an excimer laser based on ArF at 193 nm or based on KrF at 428 nm.

According to at least one embodiment, the laser radiation is pulsed laser radiation. The energy density of the laser radiation at the absorber layer is preferably at least 100 mJ/cm$^2$ or 200 mJ/cm$^2$ and/or at most 850 mJ/cm$^2$. The pulse duration of the laser radiation in particular amounts to at least 1 ns or 2 ns or 5 ns and/or at most 100 ns or 40 ns or 15 ns.

According to at least one embodiment, a light-emitting diode chip is produced by the method. The light-emitting diode chip here comprises at least the functional stack of the semiconductor layer sequence. It is likewise possible for the light-emitting diode chip to comprise at least part of the buffer layer stack, for example those layers of the buffer layer stack which are located between the absorber layer and the functional stack. The light-emitting diode chip may also contain part of the absorber layer.

A method described herein is explained in greater detail below on the basis of exemplary embodiments with reference to the drawings. Elements which are the same in the individual figures are indicated with the same reference numerals. The relationships between the elements are not shown to scale, however, but rather individual elements may be shown exaggeratedly large to assist in understanding.

BRIEF DESCRIPTION OF THE DRAWINGS

FIGS. 1, 4, 5, 6A and 6B are schematic diagrams of exemplary embodiments of methods described herein for producing optoelectronic semiconductor chips, and FIGS. 2 and 3 are schematic diagrams of modifications of methods described herein.

DETAILED DESCRIPTION

Figure 1:
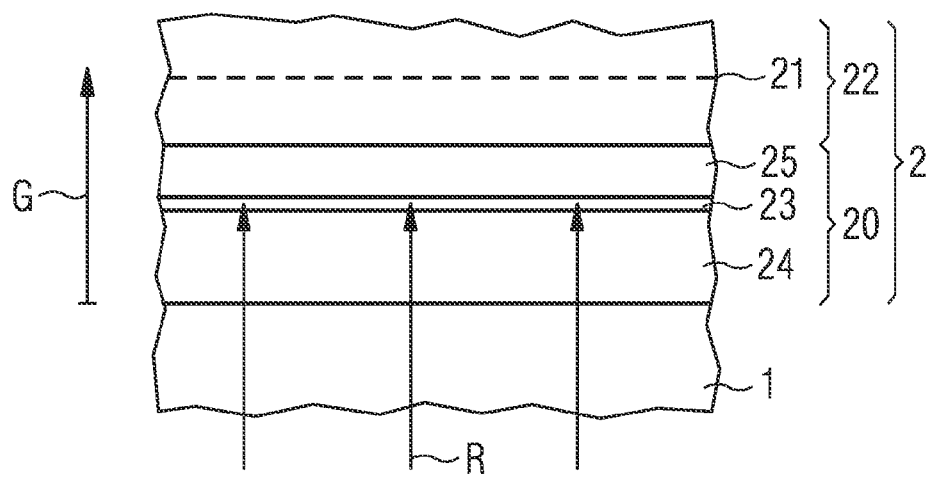

FIG. 1 shows an exemplary embodiment of a method described herein. A semiconductor layer sequence 2 based on the AlInGaN material system is grown on a carrier substrate 1, for example a sapphire substrate. The semiconductor layer sequence 2 comprises a buffer layer stack 20 and a functional stack 22. The buffer layer stack 20 is located directly between the carrier substrate 1 and the functional stack 22, along a growth direction G. The functional stack 22 comprises one or more active layers 21 for generating light, for example blue light.

The buffer layer stack 20 contains an absorber layer 23. The absorber layer 23 is located within the buffer layer stack 20. The absorber layer 23 is surrounded by further layers 24 and 25 of the buffer layer stack 20. The distance between the absorber layer 23 and the carrier substrate 1 and functional stack 22 is at least L/(4 n), as also in all the other exemplary embodiments, wherein L denotes the wavelength of the laser radiation and n is the average refractive index of the buffer layer 20.

Once it has grown, the semiconductor layer sequence 2 is detached from the carrier substrate 1 by means of laser radiation R. The laser radiation R is guided through the carrier substrate 1 to the semiconductor layer sequence 2. The laser radiation R has, for example, a wavelength of 355 nm. The laser radiation R is absorbed in the absorber layer 23 such that the absorber layer 23 is at least in part thermally and/or photochemically destroyed and such that the semiconductor layer sequence 2 is detached in the region of the absorber layer 23. The further layers 24 and 25 here separate the absorber layer 23 from the functional stack 22 and the carrier substrate 1 in order to prevent the laser radiation R from causing damage in the functional stack 22 or to the carrier substrate 1.

The further layers 24 and 25 and the carrier substrate 1 are transmissive, preferably transparent, to the laser radiation R. This means that the absorption of the carrier substrate 1 or the further layers 24 and 25 for the laser radiation R preferably amounts to at most 100 cm$^{-1}$. The absorber layer 23 is formed from a material which has a band edge such that the laser radiation R is absorbed in the absorber layer 23. A layer of the functional stack 22, which layer is closest to the carrier substrate 1, for example likewise has a band edge such that said layer has an absorbent action for the laser radiation R. The absorber layer 23, however, keeps the laser radiation R away from said layer of the functional stack 22 which is located closest to the carrier substrate 1 or at least reduces the intensity of said radiation. The functional stack 22 may, however still be heated by and/or absorb the laser radiation R over several hundred nanometres starting from the buffer layer stack 20, but without there being any significant effect on detachment in the region of the absorber layer 23.

Further production steps for the semiconductor chip such as applying electrical contact structures or mirror layers, producing a roughening or dividing the functional stack 22 into individual semiconductor chips are in each case not shown in the drawings for simplicity of illustration.

FIGS. 2 to 6 illustrate modifications and further exemplary embodiments of the method described herein. Each of FIGS. 2 to 6 plots a position x in nm relative to a radiant intensity S of laser radiation R in arbitrary units, a.u. for short, and a refractive index n of the carrier substrate 1 and of the semiconductor layer sequence 2. The scale for refractive index n is in each case located on the left and the scale for radiant intensity S on the right in the figures. This is indicated in FIGS. 2 to 6 by an arrow pointing left or right, starting from the associated curve. A radiant intensity S=1 here corresponds to the radiant intensity irradiated into the carrier substrate 1.

Figure 2:
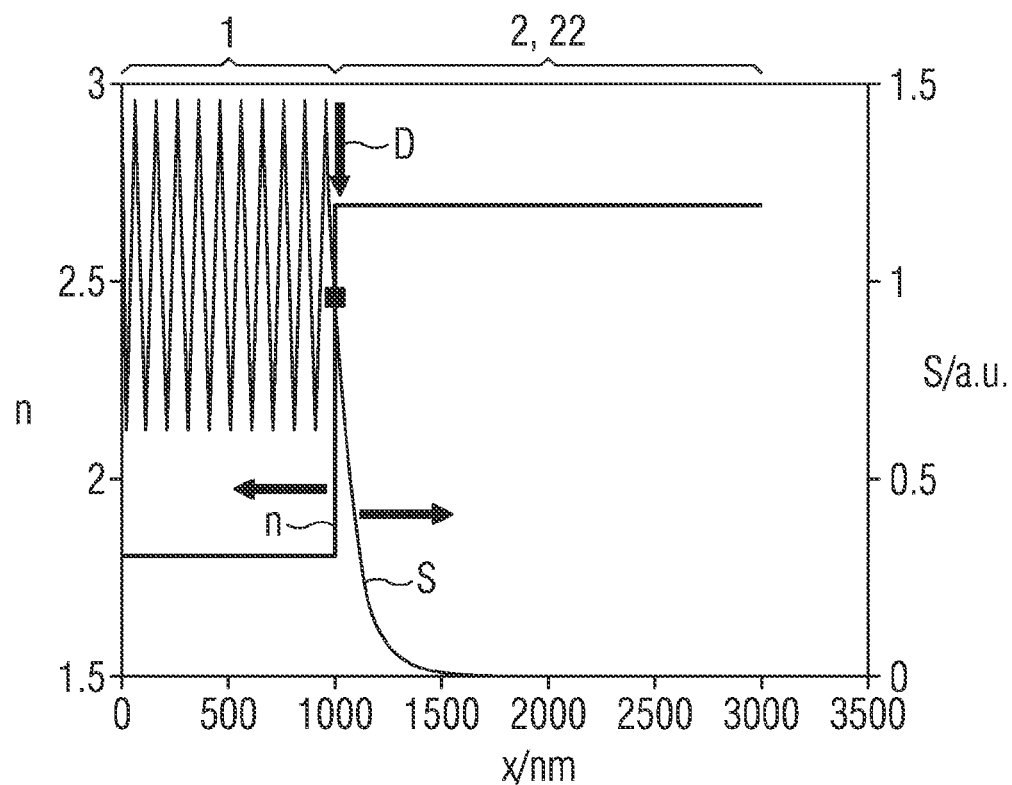

In the modification illustrated in FIG. 2, the semiconductor layer sequence 2 has no buffer layer stack. In other words, the functional stack 22 follows directly on the carrier substrate 1. A detachment point D is therefore located directly at the interface between the carrier substrate 1 and the semiconductor layer sequence 2, since it is at this point that the laser radiation starts to be absorbed. As a result, the carrier substrate 1 and the semiconductor layer sequence 2 with the functional stack 22 are exposed to the risk of being damaged by the detachment process.

Furthermore, the radiant intensity S at the detachment point D is reduced to roughly 95% of the radiant intensity emitted onto the carrier substrate 1, since the laser radiation R is partially reflected at the interface between the carrier substrate 1 and the semiconductor layer sequence 2. A higher radiant intensity must thus be irradiated into the carrier substrate 1 in order to provide the radiant intensity required for detachment at the detachment point D.

In the modification in FIG. 3, a buffer layer 20 as a single layer is located between the functional stack 22 and the carrier substrate 1. The buffer layer 20 has a thickness of L/(4 n). In other words, the buffer layer 20 provides an antireflection layer for the laser radiation. In this way, a reduction of the radiant intensity S at the detachment point D is reduced and a higher intensity achieved. The detachment point D is, however, located directly adjacent the functional stack 22, such that the functional stack 22 may be damaged by detachment.

FIG. 4 shows an exemplary embodiment of the method. The buffer layer stack 20 is located between the carrier substrate 1 and the functional stack 22. Directly adjacent the carrier substrate 1, the buffer layer stack 20 has a layer, for instance of AlN, which acts as an antireflection layer and has a thickness of L/(4 n). This antireflection layer follows the absorber layer 23. The absorber layer 23, which is for instance formed from GaN, here has a comparatively large thickness of L/(2 n$_A$), wherein n$_A$ is the average refractive index of the absorber layer 23.

Five pairs of layers, for instance of AlN layers 25 with a low refractive index and AlGaN layers 24 with a high refractive index, are located between the absorber layer 23 and the functional stack 22. These further layers 24 and 25 create a Bragg reflector which reflects the laser radiation in the direction away from the functional stack 22. The layers 24 and 25 each have a thickness of L/(4 n). As a result, the radiant intensity S at the functional stack 22 is distinctly reduced. The absorber layer 23 is located preferably at a maximum of the radiant intensity S. Due to the Bragg reflector, the layers 24 and 25 increase the radiant intensity S interferometrically by almost a factor of 2 in comparison with the structure as shown in FIG. 2.

One of the layers of AlGaN with a high refractive index 24 is preferably located directly on the functional stack 22. The layer of the functional stack 22 closest to the buffer layer stack 20 has a thickness which is greater than the thickness of the entire buffer layer stack 20. Said layer of the functional stack 22 is for example a GaN layer. The entire semiconductor layer sequence 2 is based on the AlInGaN material system.

FIG. 5 shows a further exemplary embodiment. The buffer layer stack 20 has an overall thickness of (3 L)/(4 n) and is formed of two layers 25, for instance of AlN, between which is located the absorber layer 23, for instance of GaN. The carrier substrate 1 is a sapphire substrate and the layer of the functional stack 22 closest to the carrier substrate 1 is a GaN layer.

The absorber layer 23 is located at the second maximum, calculated from the carrier substrate 1, of radiant intensity S. The absorber layer 23 here has a comparatively small thickness of 5 nm. Alternatively, as also in all the other exemplary embodiments, the absorber layer 23 may be grown from InGaN. The detachment point D is in the region of the absorber layer 23.

Figure 6A:
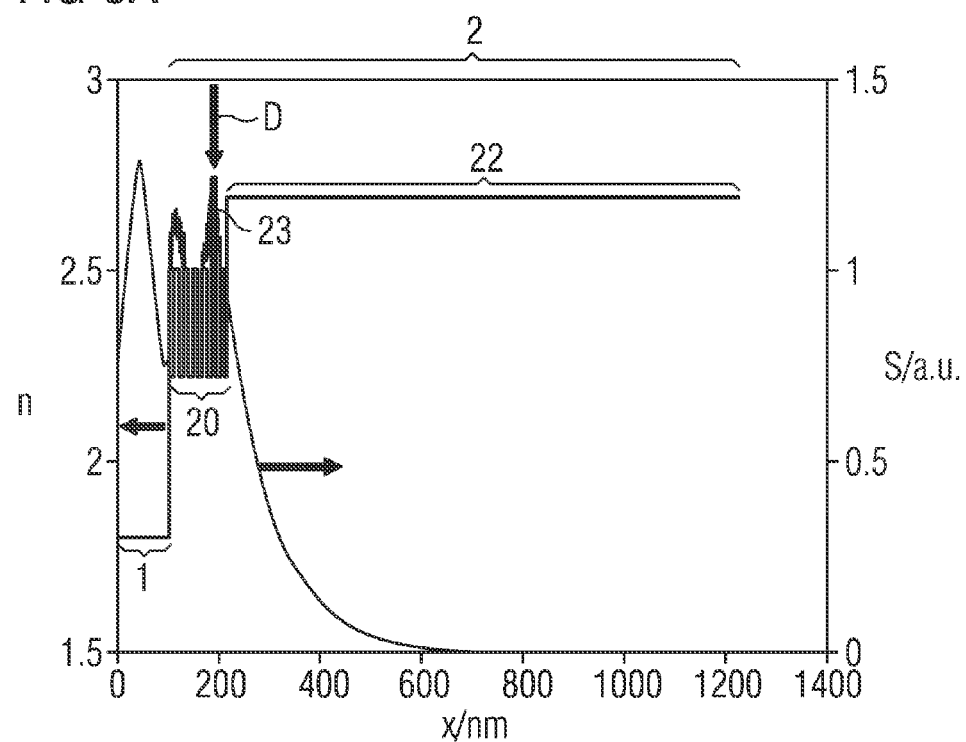
Figure 6B:
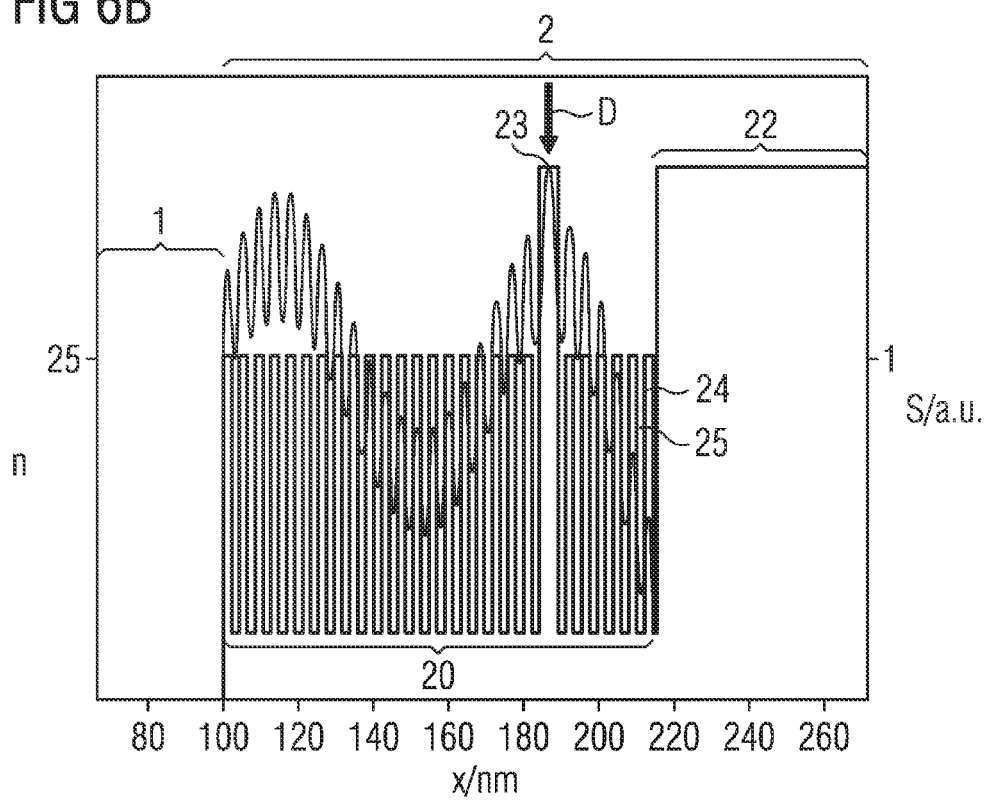

FIGS. 6A and 6B show a further exemplary embodiment. FIG. 6B is here an enlargement of a portion from FIG. 6A. The buffer layer stack 20 is formed from a superlattice with alternating layers for instance of AlN and AlGaN. The thickness of the layers of the superlattice is for example 2 nm and the superlattice comprises for example 28 pairs of AlN layers and AlGaN layers.

The absorber layer 23 is a GaN layer with a thickness of 5 nm. The absorber layer 23 is located at a second intensity maximum of the radiant intensity S, calculated from the interface between the carrier substrate 1 and the semiconductor layer sequence 2. The superlattice is shown in greater detail in FIG. 6B.

Thanks to the superlattice and the positioning of the absorber layer 23 at the maximum of the radiant intensity S, the intensity of the laser radiation at the absorber layer is increased by approximately 30% in comparison with the structure of the semiconductor layer sequence illustrated in FIG. 2. The entire thickness of buffer layer stack 20 amounts, as also in FIG. 5, to (3 L)/(4 n). Accordingly, the intensity of the laser radiation irradiated onto the carrier substrate 1 may be distinctly reduced while ensuring a constant intensity at the absorber layer 23.

The invention described here is not restricted by the description given with reference to the exemplary embodiments. Rather, the invention encompasses any novel feature and any combination of features, including in particular any combination of features in the claims, even if this feature or this combination is not itself explicitly indicated in the claims or exemplary embodiments.

The invention claimed is:

1. A method for producing optoelectronic semiconductor chips comprising the steps:
    A) providing a carrier substrate;
    B) applying a semiconductor layer sequence onto the carrier substrate; and
    C) detaching the finished semiconductor layer sequence (2) from the carrier substrate by means of laser radiation (R) with a wavelength through the carrier substrate,
    wherein the semiconductor layer sequence, in the direction away from the carrier substrate, has a buffer layer stack and a functional stack,
    wherein the functional stack comprises at least one active layer for generating light,
    wherein at least one absorber layer is located within the buffer layer stack,
    wherein the absorber layer is formed from a material for absorbing the laser radiation and all the remaining layers of the buffer layer stack are transmissive to the laser radiation,
    wherein in step C) the semiconductor layer sequence is detached from the carrier substrate in the region of the absorber layer, and
    wherein the absorber layer in step C) is located at a maximum of a radiant intensity of the laser radiation in the semiconductor layer sequence.

2. The method according to claim 1, wherein a distance between the absorber layer and edges of buffer layer stack amounts, along a growth direction of the semiconductor layer sequence, to at least $L/(4\,n)$,
    wherein L is the wavelength of the laser radiation and n the average refractive index of the buffer layer stack,
    wherein a thickness of the buffer layer stack is between 80 nm and 5 μm inclusive,
    wherein the semiconductor layer sequence is grown epitaxially or by means of sputtering on the carrier substrate such that the carrier substrate is a growth substrate, and
    wherein a material of the functional stack has an absorbent action for the laser radiation.

3. The method according to claim 1, wherein the absorber layer is located, counting from the carrier substrate, at the first maximum of the radiant intensity in the buffer layer stack.

4. The method according to claim 1, wherein the absorber layer is located, counting from the carrier substrate, at the second maximum of the radiant intensity in the buffer layer stack.

5. The method according to claim 1, wherein the buffer layer stack has a thickness of $[(1+2N)\,L]/(4\,n)$, and
    wherein L is the wavelength of the laser radiation, n is the average refractive index of the buffer layer stack and N is a natural number greater than or equal to one.

6. The method according to claim 1, wherein the buffer layer stack in the region between the carrier substrate and the absorber layer is an antireflection layer for the laser radiation.

7. The method according to claim 6, wherein the buffer layer stack in the region between the absorber layer and the functional stack is a Bragg reflector for the laser radiation.

8. The method according to claim 7, wherein the exactly one absorber layer has a thickness of $L/(2\,n_A)$, and
    wherein L is the wavelength of the laser radiation and $n_A$ is the refractive index of the absorber layer.

9. The method according to claim 1, wherein a thickness of the exactly one absorber layer, along the growth direction, amounts to between 1.5 nm and $L/(12\,n_A)$ inclusive, and
    wherein L is the wavelength of the laser radiation and $n_A$ is the refractive index of the absorber layer.

10. The method according to claim 1, wherein the buffer layer stack has a superlattice with a plurality of alternating layers with a high and with a low refractive index, and
    wherein a layer thickness of the alternating layers is in each case between 1.5 nm and 15 nm inclusive.

11. The method according to claim 10, wherein the superlattice comprises between 5 and 50 pairs inclusive of the alternating layers, and
    wherein a refractive index difference between the alternating layers is between 0.1 and 0.35 inclusive.

12. The method according to claim 1, wherein the carrier substrate is a sapphire substrate and the semiconductor layer sequence is based on AlInGaN,
    wherein the absorber layer is grown from GaN or InGaN and the remaining layers of the buffer layer stack are grown from AlN and/or AlGaN and the layer of the functional stack which is closest to the carrier substrate is a GaN layer, and
    wherein the GaN layer of the functional stack exceeds the thickness of the buffer layer stack by at least a factor of 2.

13. The method according to claim 12, wherein the wavelength of the laser radiation is between 240 nm and 380 nm inclusive, an energy density of the pulsed laser radiation at the absorber layer is between 100 mJ/cm$^2$ and 850 mJ/cm$^2$ inclusive per pulse and a pulse duration of the laser radiation amounts to between 2 ns and 40 ns inclusive.

14. The method according to claim 13, with which light-emitting diode chips are produced which comprise the functional stack and at least part of the buffer layer stack.

15. A method for producing optoelectronic semiconductor chips comprising the steps:
    A) providing a carrier substrate;
    B) applying a semiconductor layer sequence onto the carrier substrate; and
    C) detaching the finished semiconductor layer sequence (2) from the carrier substrate by means of laser radiation (R) with a wavelength through the carrier substrate,
    wherein the semiconductor layer sequence, in the direction away from the carrier substrate, has a buffer layer stack and a functional stack,
    wherein the functional stack comprises at least one active layer for generating light,
    wherein at least one absorber layer is located within the buffer layer stack, such that the at least one absorber layer is not located at one edge of the buffer layer stack and therefore does not directly adjoin the carrier substrate or the functional stack, wherein the absorber layer is formed from a material for absorbing the laser radiation and all the remaining layers of the buffer layer stack are transmissive to the laser radiation, wherein in step C) the semiconductor layer sequence is detached from the carrier substrate in the region of the absorber layer, wherein the absorber layer in step C) is located at a maximum of a radiant intensity of the laser radiation in the semiconductor layer sequence, and wherein a structure of the buffer layer stack provides for at least one of a power density of the irradiated laser radiation in the absorber layer to be boosted interferometrically, or the buffer layer stack between the carrier substrate and the absorber layer to take the form of an antireflection layer for the laser radiation.

* * * * *